(12) United States Patent
Larzul et al.

(10) Patent No.: US 9,547,040 B2
(45) Date of Patent: Jan. 17, 2017

(54) EFFICIENT EVENT DETECTION

(71) Applicant: Synopsys, Inc., Mountain View, CA (US)

(72) Inventors: Ludovic Marc Larzul, Folsom, CA (US); Frederic Maxime Emirian, Antony (FR); Sebastien Roger Delerse, Brétigny sur orge (FR)

(73) Assignee: Synopsys, Inc., Mountain Veiw, CA (US)

( * ) Notice: Subject to any disclaimer, the term of this patent is extended or adjusted under 35 U.S.C. 154(b) by 25 days.

(21) Appl. No.: 14/703,727

(22) Filed: May 4, 2015

(65) Prior Publication Data

US 2016/0327609 A1 Nov. 10, 2016

(51) Int. Cl.
*G06F 17/50* (2006.01)
*G06F 11/22* (2006.01)
*G01R 31/317* (2006.01)
*G01R 31/3177* (2006.01)

(52) U.S. Cl.
CPC ..... *G01R 31/31723* (2013.01); *G01R 31/3177* (2013.01); *G01R 31/31703* (2013.01); *G01R 31/31705* (2013.01)

(58) Field of Classification Search
CPC .................................................. G06F 17/5036
USPC .......................................................... 716/136
See application file for complete search history.

(56) References Cited

U.S. PATENT DOCUMENTS

| 2015/0095866 A1* | 4/2015 | Cohen | G01R 31/318335 716/113 |
| 2016/0098504 A1* | 4/2016 | Larzul | G06F 17/5027 716/136 |

\* cited by examiner

*Primary Examiner* — Suresh Memula
(74) *Attorney, Agent, or Firm* — Fenwick & West LLP

(57) ABSTRACT

Embodiments relate to the emulation of circuits, and detecting an event in a plurality of signals in an emulated circuit. A host system incorporates global event detection logic into a design under test (DUT). An emulator emulates the DUT along with the incorporated global event detection logic. The global event detection logic divides one clock cycle of the DUT into multiple time periods. During each time period of the clock cycle, the emulator selects a different subset of signals from the plurality of signals of the DUT. The emulator determines whether an event occurred for a signal from the subset during the clock cycle. If an event is detected, the emulator generates an output indicating an event was detected among the plurality of signals.

20 Claims, 10 Drawing Sheets

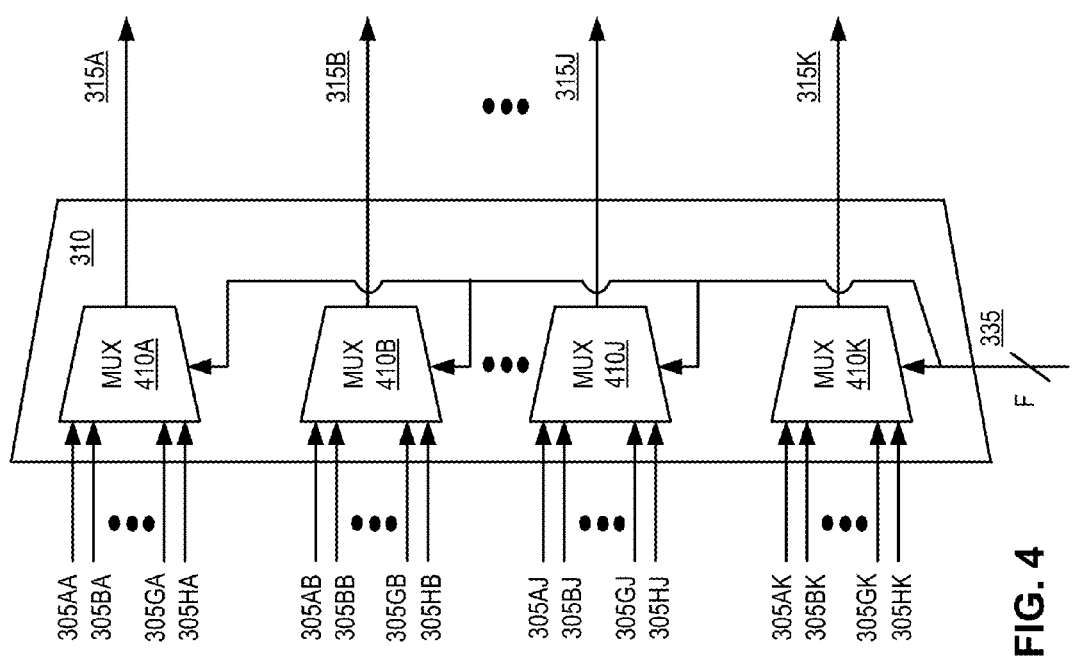

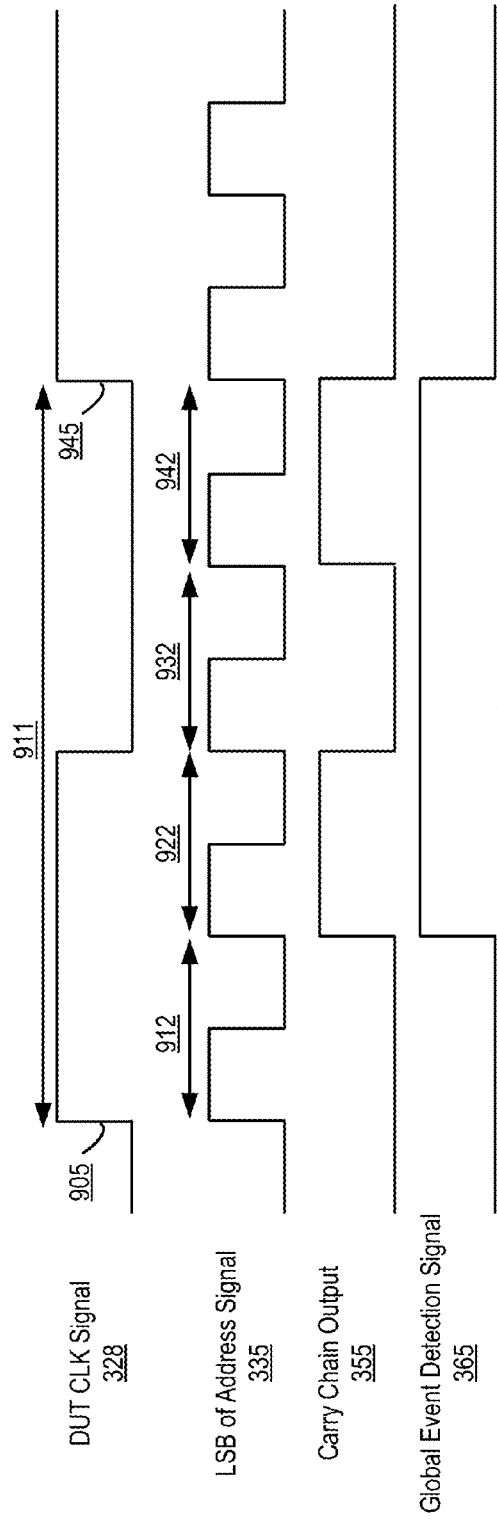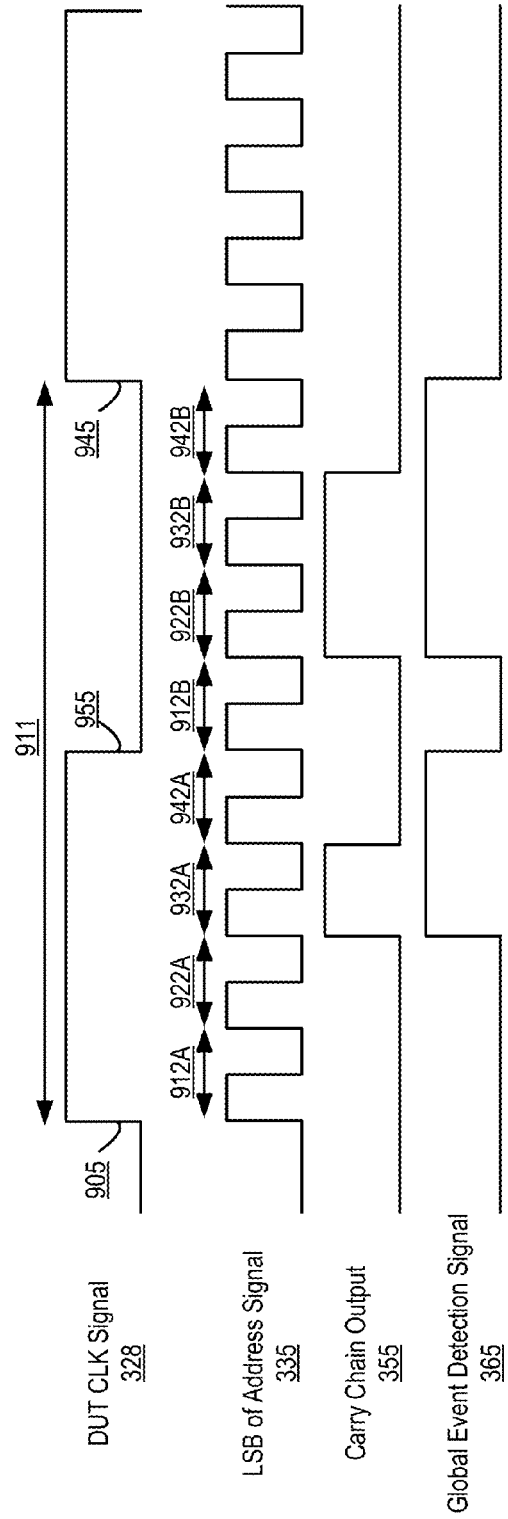

EFFICIENT EVENT DETECTION

BACKGROUND

1. Field of Art

The disclosure generally relates to the emulation of circuits, and more specifically to detecting whether at least one signal from a plurality of signals has changed its state in an emulated circuit.

2. Description of the Related Art

Emulators have been developed to assist circuit designers in designing and debugging highly complex integrated circuits. An emulator includes multiple reconfigurable components, such as field programmable gate arrays (FPGAs) that together can imitate the operations of a design under test (DUT). By using an emulator to imitate the operations of a DUT, designers can verify whether a DUT complies with various design requirements prior to a fabrication.

An aspect of emulation includes detecting among a plurality of traced signals whether at least one event has occurred (e.g., a change in a state of a signal). Detecting an event among the plurality of signals can be used, for example, to verify functionality of a DUT, estimate power consumption of a DUT, perform logic analysis, or control operations of the DUT.

For detecting an event among a plurality of signals, a conventional emulation environment implements numerous hardware resources including multiple registers, multiple XOR gates and at least one OR gate. A DUT may include billions of signals to be monitored, thus a great amount of hardware resources have to be implemented by the emulator for tracing a large number of signals. A first drawback of allocating a large amount of hardware resources for tracing signals is that these resources occupy equivalent spaces that could be used to implement the design, either logic gates in an FPGA or transistors in a specialized ASIC for emulation. A second drawback is a potential slowdown of the DUT.

Therefore, a conventional emulation environment is inefficient in terms of hardware resources for detecting that at least one event has occurred in a plurality of signals.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

FIG. 4 is a circuit diagram of a signal selector of the global event detection logic, according to one embodiment.

FIG. 5 is a circuit diagram of a memory device of the global event detection logic, according to one embodiment.

FIG. 9A illustrates example waveforms for detecting an event in a plurality of signals according to the global event detection logic employing one of the output generators of FIGS. 8A through 8C.

FIG. 9B illustrates example waveforms for detecting an event in a plurality of signals based on different edges of a DUT clock signal, using global event detection logic employing one of the output generators of FIGS. 8B and 8C.

DETAILED DESCRIPTION

Figure 1:
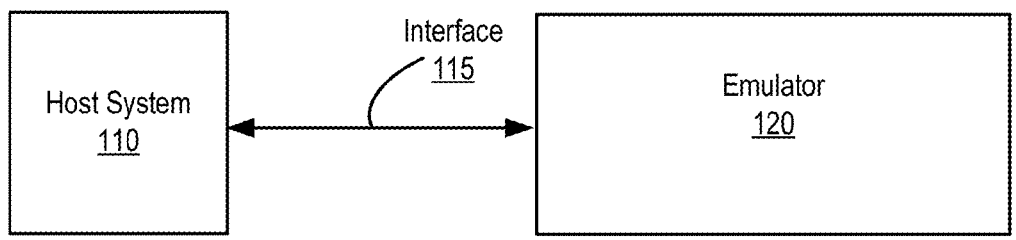
FIG. 1 is a block diagram of an emulation environment, according to one embodiment.

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. The figures depict embodiments of the disclosed system (or method) for purposes of illustration only. It should be recognized from the following description that alternative embodiments of the structures and methods illustrated herein may be employed without departing from the principles described herein.

The figures use like reference numerals to identify like elements. A letter after a reference numeral, such as "102A," indicates that the text refers specifically to the element having that particular reference numeral. A reference numeral in the text without a following letter, such as "120," refers to any or all of the elements in the figures bearing that reference numeral.

Configuration Overview

A disclosed system (and method and computer program product) includes an emulation environment that performs efficient event detection in a plurality of signals by limiting the amount of hardware resources used for tracking the states of signals.

One embodiment of the emulation environment includes a host system and an emulator. The host system incorporates global event detection logic into a design under test (DUT) and configures the emulator to emulate the DUT with the incorporated global event detection logic. During emulation, the global event detection logic tracks multiple signals of the DUT and determines whether at least one event has occurred among the multiple signals (e.g., whether at least one of the signals has changed states).

In one embodiment, for each clock cycle of the DUT, the global event detection logic analyzes the multiple signals at least once and determines whether at least one event has occurred among the multiple signals. During a clock cycle of the DUT, the signals are analyzed in groups or subsets. The clock cycle is divided into multiple time periods, and during each time period a different subset of signals is analyzed to determine whether an event occurred.

In one embodiment, the global event detection logic includes a signal selector, a value comparator, a carry chain block, and an output generator. During each time period, the signal selector selects a different subset of signals from a plurality of signals. For each signal in the selected subset of signals, the value comparator determines whether occurred value has changed since the last detection was performed by comparing the current state of the signal (i.e., the state of the signal in the current DUT clock cycle) and the memorized state of the signal (i.e., state of the signal the last time the detection operation was performed). The carry chain block generates a carry chain output for the selected subset of signals. The carry chain output indicates whether at least one signal value has changed according to the value comparator in the selected subset of signals. The output generator generates a global event detection signal for the plurality of signals based on the carry chain output. The global event detection signal indicates whether at least one signal value has changed in the plurality of signals. If the carry chain output indicates that a signal value has changed, the global event detection signal will indicate that at least one event was detected among the plurality of signals. After analyzing the selected subset of signals, the global event detection logic analyzes the next subset of signals during the next time period in the DUT clock cycle. After analyzing all of the plurality of signals, the output generator resets the global event detection signal.

A signal herein refers to, but is not limited to, a net, a wire, a variable, a signal, a port, or an element of a design having a value carried, monitored or traced.

An event herein refers to, but is not limited to, a change in a state of a signal, which may also be referred to as a toggle. For example, a rising edge event occurs when a signal transitions from a low state to a high state. Similarly, a falling edge event occurs when a signal transitions from a high state to a low state.

Example Emulation Environment

FIG. 1 is a block diagram illustrating an emulation environment 100, according to one embodiment. The emulation environment 100 includes a host system 110 and an emulator 120. The host system 110 communicates with the emulator 120 through an interface 115.

The host system 110 configures the emulator 120 for emulating a DUT and communicates with the emulator 120 during emulation of the DUT. A DUT is one or more circuit designs that are to be emulated by the emulator 120. The host system 110 may be a single computer or a collection of multiple computers. In the embodiment where the host system 110 is comprised of multiple computers, the functions described herein as being performed by the host system 110 may be distributed among the multiple computers. The host system 110 may be indirectly connected to the emulator 120 through another device, computer or network.

The host system 110 receives from a user a description of a DUT to be emulated. The description of the DUT is in a type of hardware description language (HDL), for example, register transfer language (RTL). The host system 110 creates a gate level netlist based on the HDL description of the DUT. The host system 110 uses the netlist to partition the DUT and maps each partition to one or more logic circuits included in the emulator 120.

The host system 110 incorporates global event detection logic into the DUT that detects whether at least one event occurred among multiple signals in the DUT. In one embodiment, the host system 110 incorporates the global event detection logic into the DUT prior to creating the gate level netlist. In other embodiments, the global event detection logic is incorporated into the DUT after creating the gate level netlist and before or after partitioning the DUT. Alternatively, the global event detection logic may be incorporated into the DUT at different stages. For example, a portion of the global event detection logic can be incorporated before creating the gate level netlist and another portion can be incorporated after creating the gate level netlist. In another embodiment, the global event detection logic is independent from the DUT. In this embodiment, the global event detection logic is added during a step independently from the DUT, and connected to an intermediate representation of the DUT at a later step, for example after partitioning of the design or when generating the FPGA binary files.

The host system 110 transmits a description of the DUT with the incorporated global event detection logic (gate level or RTL description) to the emulator 120 in one or more bit streams through the interface 115. The bit streams may also include representations of the DUT, partitioning information, mapping information, and design constraints for configuring the emulator 120.

Additionally, during emulation of the DUT or after completion of the emulation by the emulator 120, the host system 110 receives emulation results from the emulator 120 through the interface 115. The emulation results include event information indicating whether an event is detected in a signal from multiple signals. The event information is generated based on a global event detection signal output by the global event detection logic. In one embodiment, the host system 110 receives the event information by receiving the global event detection signal directly from the emulator 120.

The host system 110 may process and convert the emulation results for analysis and display to users. Based on the emulation results, the user may iterate the process of modifying the DUT, executing the emulation and performing analysis until design requirements are satisfied.

The emulator 120 is a hardware system that emulates DUTs. The emulator 120 includes multiple configurable logic circuits that together can emulate a DUT. In one embodiment, the logic circuits included in the emulator are field-programmable gate arrays (FPGAs).

For a DUT that is to be emulated, the emulator 120 receives from the host system 110 or from other computing devices (not shown) one or more bit streams including a description of the DUT with the incorporated global event detection logic. The bit streams further describe partitions of the DUT created by the host system 110, mappings of the partitions to the FPGAs of the emulator 120, and design constraints. Based on the bit streams, the emulator 120 configures the FPGAs to perform the functions of the DUT.

The emulator 120 emulates the DUT along with the incorporated global event detection logic. Based on the emulation, the emulator 120 generates emulation results, which are transmitted to the host system 110 for analysis.

The interface 115 is a communication medium that allows communication between the host system 110 and the emulator 120. In one embodiment, the interface 115 is one or more cables with electrical connections. For example, the interface 115 may be one or more RS232, USB, LAN, optical, or custom built cables. In other embodiment, the interface 115 is a wireless communication medium or a network with one or more points of access. For another example, the interface 115 may be a wireless communication medium employing a Bluetooth® or IEEE 802.11 protocol.

Figure 2:
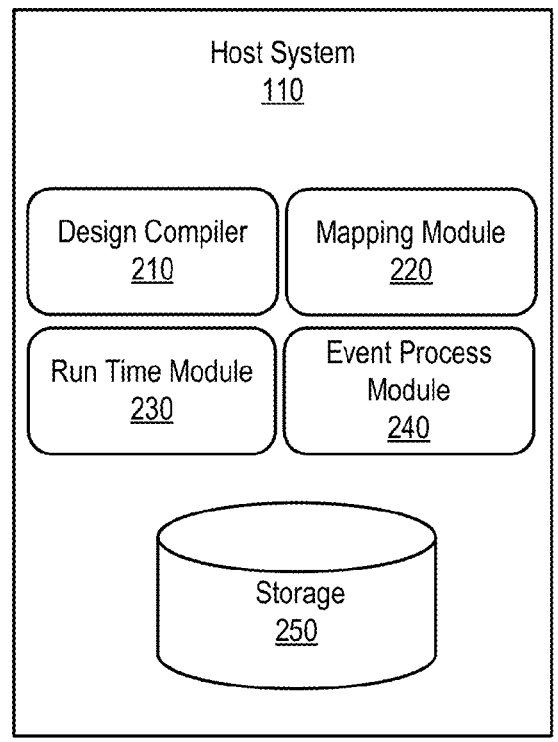
FIG. 2 is a block diagram illustrating a host system, according to one embodiment.

FIG. 2 is a block diagram illustrating the host system 110 in more detail, according to one embodiment. The host system 110 includes a design compiler 210, mapping module 220, run time module 230, event process module 240, and storage 250. Each of these components may be embodied as hardware, software, firmware, or a combination thereof. Together these components provide designs to configure the emulator 120 and monitor the emulation results.

The design compiler 210 converts HDL of DUTs into gate level logic. For a DUT that is to be emulated, the design compiler 210 receives a description of the DUT in HDL (e.g., RTL or other level of abstraction). The design compiler 210 synthesizes the HDL of the DUT to create a gate level netlist with a description of the DUT in terms of gate level logic.

In one embodiment, the design compiler 210 incorporates global event detection logic into the DUT. In one embodiment, the design compiler 210 incorporates the global event detection logic prior to synthesizing the HDL to create the netlist. In this embodiment, prior to synthesizing, the design compiler 210 retrieves HDL of the global event detection logic from the storage 250 and edits the HDL of the DUT to include the retrieved HDL of the global event detection logic.

In another embodiment, the design compiler 210 incorporates the global event detection logic after creating the netlist for the DUT. In this embodiment, the design compiler 210 retrieves a gate level description of the global event detection logic from the storage 250 and edits the gate level netlist to include the gate level description of the global event detection logic.

In another embodiment, the design compiler 210 incorporates the global event detection logic at distributed levels. The design compiler 210 incorporates a portion of the global event detection logic prior to synthesizing the HDL and another portion of the global event detection logic after synthesizing the HDL.

The global event detection logic receives N number of design signals from the DUT and generates a global event detection signal to indicate whether at least one event occurred among the N number of design signals during a clock cycle of the DUT. In one embodiment, the global event detection logic resets the global event detection signal when one clock cycle of the DUT ends or at predetermined durations. In another embodiment, the global event detection logic resets the global event detection signal when a DUT clock transitions from one state to another.

The global event detection logic analyzes design signals in multiple groups/subsets during a clock cycle of the DUT. In one embodiment, the global event detection logic receives a clock signal of the DUT and divides one clock cycle of the DUT into multiple time periods. During each time period, the global event detection logic analyzes one of the subsets of signals so that at the end of the clock cycle of the DUT all of design signals have been analyzed to determine whether at least one event occurred during the clock cycle of the DUT. By analyzing the design signals in groups, circuit components can be shared and an amount of hardware resources needed to detect an event in the design signals can be reduced.

In one embodiment, multiple global event detection logics can be incorporated into the DUT, where each global event detection logic analyzes a corresponding number of design signals to determine whether an event occurred in any one of the corresponding design signals.

The mapping module 220 partitions DUTs and maps partitions to emulator components. After the design compiler 210 creates a gate level netlist of the DUT, the mapping module 220 partitions the DUT at the gate level into a number of partitions using the netlist. In the embodiment where the design compiler 210 incorporates the global event detection logic into the DUT, the mapping module 220 partitions the DUT with the incorporated global event detection logic. In another embodiment, the mapping module 220 incorporates the global event detection logic instead of the design compiler 210. In this embodiment, based on a gate level netlist of the DUT, the mapping module 220 partitions the DUT and incorporates the global event detection logic to one or more partitions.

The mapping module 220 maps each partition to one or more FPGAs of the emulator 120. The mapping module 220 performs the partitioning and mapping using design rules, design constraints (e.g., timing or logic constraints), and information about the emulator 120. For each partition, the mapping module 220 generates a bit stream describing the design logic included in the partition and the mapping to one or more FPGAs of the emulator 120. The bit streams may also include information about connections between components and other design information. The mapping module 220 transmits the bits streams to the emulator 120 so that the FPGAs of the emulator 120 can be configured for emulating the DUT with the global event detection logic.

The run time module 230 controls emulations performed on the emulator 120. The run time module 230 may cause the emulator 120 to start or stop executing the emulations. Additionally, the run time module 230 may provide input signals/data to the emulator 120 for emulating a DUT. The input signals may be provided directly to the emulator 120 through the interface 115 or indirectly through other input signal devices. For example, with the run time module 230 the host system 110 may control an input signal device such as a test board, signal generator, or a power supply, to provide the input signals to the emulator 120.

The event process module 240 processes emulation results produced by the emulator 120. During the emulation of a DUT by the emulator 120 or after completing the emulation, the event process module 240 receives emulation results from the emulator 120. The emulation results include event information for multiple clock cycles indicating whether at least one event was detected among multiple signals. The event information is generated based on a global event detection signal output by the global event detection logic. In one embodiment, the host system 110 receives the event information by receiving the global event detection signal directly from the emulator 120. In one embodiment, the event process module 240 stores the emulation results in the storage 250.

Figure 3:
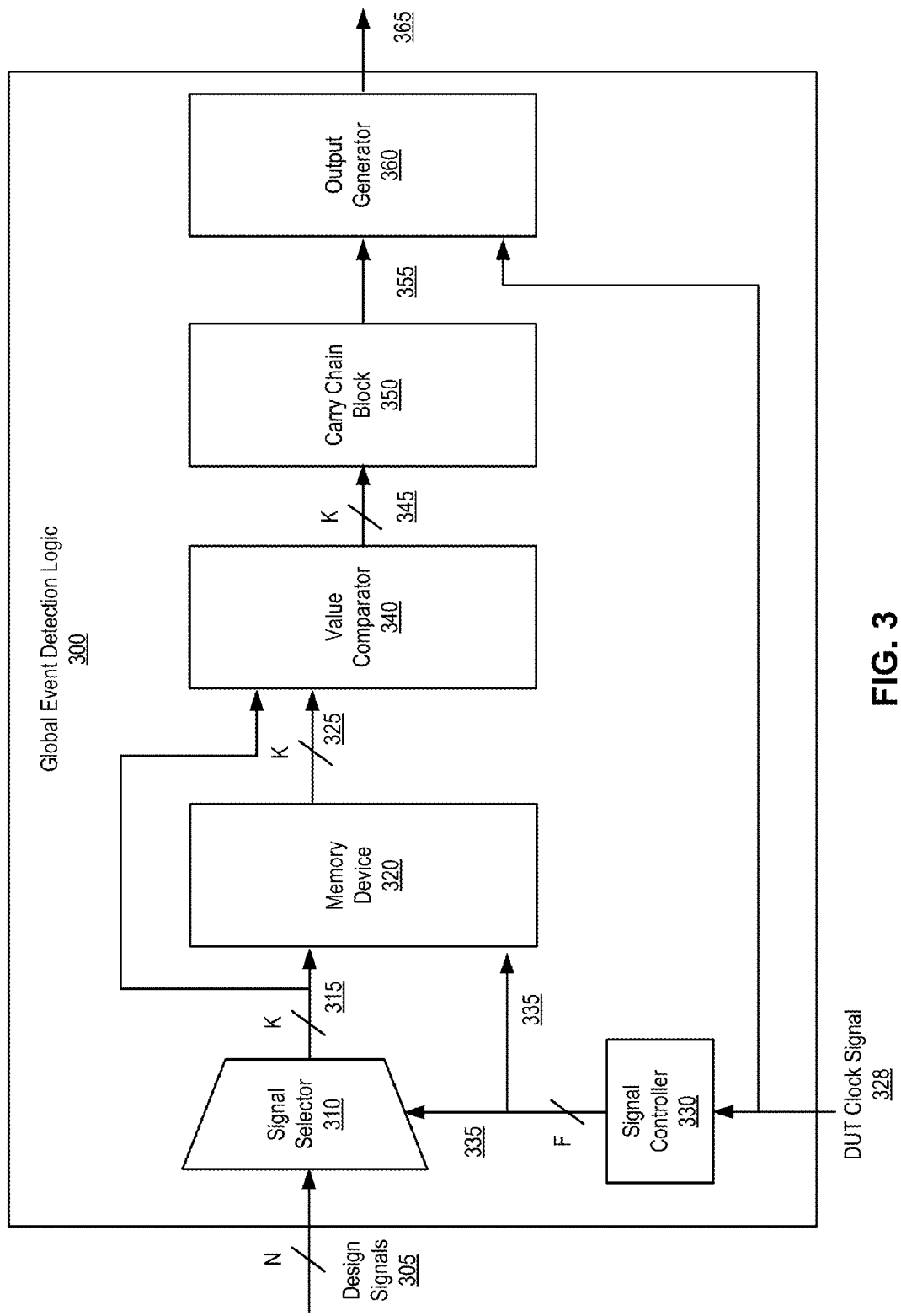
FIG. 3 is a circuit diagram of global event detection logic included in a design under test (DUT), according to one embodiment.

Turning to FIG. 3, one embodiment of the global event detection logic 300 is illustrated. In one embodiment, the global event detection logic 300 receives N number of design signals 305 and outputs a global event detection signal 365 to indicate whether at least one event has occurred in the design signals 305 during a clock cycle of the DUT. The global event detection logic 300 receives the DUT clock signal 328 which is used to operate the DUT.

In one embodiment, during each clock cycle of the DUT clock signal 328, the global event detection logic 300 analyzes the design signals 305 at least once to determine whether at least one event occurred during the clock cycle. The global event detection logic 300 divides one clock cycle of the DUT clock signal 328 into at least H number of time periods (a clock cycle of the DUT clock signal 328 may also be referred to as a DUT clock cycle herein). During a time period, the global event detection logic 300 can analyze at most K number of design signals. Different signals can be analyzed during a different time period. For example, when K is 32, and H is 4, a single global event detection logic 300 can analyze up to 128 signals.

In one embodiment, the global event detection logic 300 includes a signal selector 310, a memory device 320, a signal controller 330, a value comparator 340, a carry chain block 350, and an output generator 360. Together, these components are integrated with the DUT and operate to determine whether an event has occurred in a signal from the N number of design signals 305.

In one embodiment, the signal controller 330 receives as an input the DUT clock signal 328 and outputs an address signal 335 having F bits. In one embodiment, the signal controller 330 generates the address signal 335 at a higher frequency using the DUT clock signal 328. The address signal 335 at a higher frequency can be used to divide one clock cycle of the DUT clock signal 328 into multiple time periods. According to the address signal 335, the global event detection logic 300 can analyze each design signal 305 during a single cycle of the DUT clock signal 328.

In one embodiment, the signal controller 330 generates the address signal 335 at a frequency that is at least a number of subsets (e.g., H) times faster than the frequency of the DUT clock signal 328. For example, the global event detection logic 300 can analyze at least 4 subsets (or at least 4 time periods in one clock cycle of the DUT) with 32 signals per subset (i.e., H=4, K=32). In this example, if the operating frequency of the DUT is 1 MHz, the address signal 335 can be generated at 4 MHz for the global event detection logic 300 to analyze up to '128' design signals 305 per one clock cycle of the DUT clock signal 328.

The signal selector 310 selects a subset of signals 315 from design signals 305 to be analyzed during a current time period. The signal selector 310 receives the N number of design signals 305 as inputs and outputs a subset of signals 315. From the N number of design signals 305, the signal selector 310 selects K number of design signals 305 to be output as the selected subset of signals 315. The signal selector 310 selects the K number of design signals 305 according to the address signal 335 from the signal controller 330. Based on changes to the address signal 335, the signal selector 310 selects each design signal 305 at least once as part of a subset of signals during a clock cycle of the DUT clock signal 328.

The memory device 320 stores the previous states of the design signals 305. The memory device 320 receives as inputs the selected subset of signals 315 from the signal selector 310 and the address signal 335 from the signal controller 330. Based on the address signal 335, the memory device 320 outputs the stored previous states 325 of the selected subset of signals 315 (e.g., the states of the signals 315 stored in the previous clock cycle of the DUT clock signal 328). Further, the memory device 320 stores the current states of the selected subset of signals 315 received from the signal selector 310. In one embodiment, the current states of the signals 315 replace the previous states 325 in the memory device 320. The stored current states of the selected subset of signals 315 are outputted the next time the memory device 320 receives values for the signals 315 (e.g., during the next DUT clock cycle).

The value comparator 340 determines whether a new value occurred for each signal in the subset of signals 315. The value comparator 340 receives as inputs the selected subset of signals 315 from the signal selector 310 (i.e., the current states of the signals 315) and the previous states 325 of the selected subset of signals 315 from the memory device 320. For each of the selected subset of signals 315, the value comparator 340 compares the current state of the design signal with the previous state of the design signal and outputs a value comparison signal 345 indicating whether the current state of the design signal is different from its previous state (i.e., indicating whether the design signal has toggled during the current DUT clock cycle). Hence, for the K number of signals 315, the value comparator 340 outputs K number of value comparison signals 345 (one value comparison signal 345 for each of the K number of design signals 315). In one embodiment, a value comparison signal 345 has a high state if a corresponding design signal has toggled during the current DUT clock cycle, and a low state if the design signal has not toggled.

The carry chain block 350 aggregates value comparison signals 345 from the value comparator 340 and generates a carry chain output 355. The carry chain block 350 receives as inputs the value comparison signals 345 output by the value comparator 340. The carry chain block 350 generates the carry chain output 355 according to the K number of value comparison signals 345. The carry chain output 355 indicates whether at least one value of a signal 315 has changed among the selected subset of signals 315. In one embodiment, if at least one of the K number of value comparison signals 345 has a high state, the carry chain block 350 generates the carry chain output 355 in a high state to indicate that at least one event occurred in the selected subset of signals 315. If all value comparison signals 345 have low states, the carry chain block 350 generates the carry chain output 355 in a low state to indicate no event occurred in the selected subset of signals 315.

The output generator 360 generates a global event detection signal 365 indicating whether at least one event occurred among the design signals 305. The output generator 360 receives the DUT clock signal 328 and the carry chain output 355 from the carry chain block 350 for the selected subset of signals 315. The output generator 360 generates the global event detection signal 365 based on the carry chain output 355 in the current time period and a state of the global event detection signal 365 in a previous time period prior to the current time period. In one embodiment, if the carry chain output 355 is in a high state and/or the global event detection signal 365 was in a high state in the previous time period, the output generator 360 outputs the event detection signal 365 in a high state to indicate that at least event occurred among the design signals 305 during the current DUT clock cycle. If the carry chain output 355 is in a low state and the global event detection signal 365 was in a low state in the previous time period, the output generator 360 outputs the event detection signal 365 in a low state to indicate that no events have yet been detected among the design signals 305 during the current DUT clock cycle.

In one embodiment, the output generator 360 resets the global event detection signal 365 (e.g., to a low state) when a next clock cycle of the DUT clock signal 328 starts (i.e., when the current clock cycle of the DUT clock signal 328 ends). As an example, assume that at the beginning of a clock cycle of the DUT clock signal 328, the output generator 360 resets the global event detection signal 365 to a low state to indicate no event has yet been detected in the design signals 305 during the current DUT clock cycle. If the carry chain block 350 outputs a carry chain output 355 in a high state at any time during the current clock cycle, the output generator 360 outputs the global event detection signal 365 in a high state to indicate at least one value changed among the design signals 305 in the current clock cycle of the DUT clock signal 328. Once the global event detection signal 365 is in the high state indicating a value of a signal 305 changed among the design signals 305, the output generator 360 maintains the global event detection signal 365 in the high state for the remainder of the current DUT clock cycle regardless of any changes to the carry chain output 355. The output generator 360 then resets the global event detection signal 365 at the start of the next DUT clock cycle.

In another embodiment, the output generator 360 resets the global event detection signal 365 at the rising edge and falling edge of each clock cycle of the DUT clock signal 328. As described below in more detail with regards to FIGS. 8B, 8C and 9B, this allows the global event detection signal 365 to indicate whether any event occurred among the design signals 305 during the high state of the DUT clock cycle and separately whether any event occurred among the design signal 305 during the low state of the DUT clock cycle.

FIG. 4 is a circuit diagram of the signal selector 310, according to one embodiment. The signal selector 310 receives N number of design signals 305AA, 305BA . . . 305HK, and selects a subset of signals 315A, 315B . . . 315K (K number of signals) based on the address signal 335. In one embodiment, the signal selector 310 is embodied as a bank of Multiplexers (MUXs) 410A, 410B . . . 410J, 410K controlled by the address signal 335. Each MUX 410 receives at most H number (N divided by K) of the design signals 305 and selects one signal 315 according to the address signal 335 during a current time period of the DUT clock cycle. For each time period the address signal 335 changes and the MUX 410 selects another of the H number of design signals 305 according to the new value of the address signal 335.

FIG. 5 is a circuit diagram of the memory device 320, according to one embodiment. The memory device 320 is a repository for storing states of the design signals 305. The memory device 320 outputs previous states of selected subsets of signals 315 stored in the memory device 320 to the value comparator 340 and stores the current states of the selected subset of signals 315 during the time period when the subset of signals 315 are selected according to the address signal 335.

In one embodiment, the memory device 320 is implemented in a K by H array structure having K columns and H rows. In one embodiment, each column of the memory device 320 includes cells storing states of design signals 305 received by a single MUX 410. For example, one column will store the states of signals 305AA, 305BA . . . 305HA received by MUX 410A. Each row of the memory device 320 includes cells storing states of a subset of design signals 315 that may be selected by the signal selector 310 during a time period of a DUT clock cycle. For example, one row will store the states of signals 305AA, 305AB . . . 305AJ, and 305AK.

In one embodiment, the address signal 335 determines the row of the memory device 320 from which stored previous states 325 of the selected subset of signals 315 are read and to which current states of selected subset of signals 315 are written during a time period of the DUT clock cycle. For example, during a time period when signals 305AA, 305AB . . . 305AJ, 305AK are selected by the signal selector 310 as the selected subset of signals 315, a first row of the memory device 320 including cells allocated for the signals 305AA, 305AB . . . 305AJ, 305AK is selected based on the address signal 335. When the first row of the memory device 320 is selected, the memory device 320 reads and outputs to the value comparator 340 the previous states 325 stored in the cells allocated for the signals 305AA, 305AB . . . 305AJ, and 305AK. In addition, the memory device 320 stores the current states of the selected subset of signals 315 to the cells allocated for the signals 305AA, 305AB . . . 305AJ, 305AK respectively. Hence, the memory device 320 reads and writes data per row.

Figure 6:
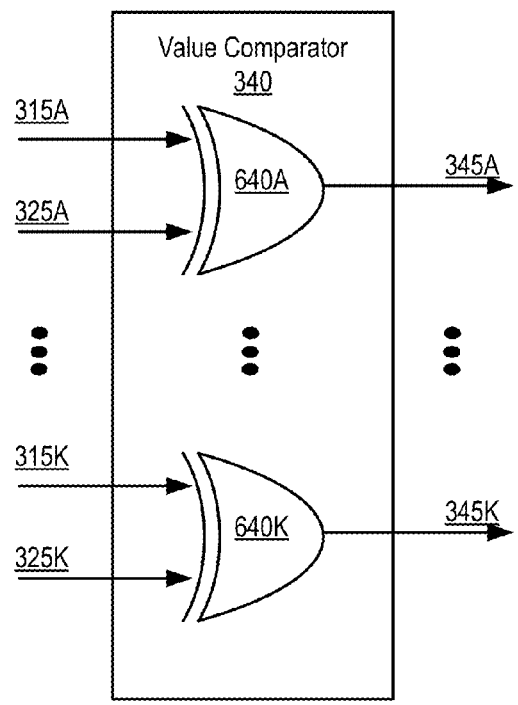
FIG. 6 is a circuit diagram of a value comparator of the global event detection logic, according to one embodiment.

FIG. 6 is a circuit diagram of the value comparator 340, according to one embodiment. The value comparator 340 determines for each signal in the selected subset of signals 315 whether a value changed since the last comparison. In one embodiment, the value comparator 340 is implemented as multiple XOR gates 640A . . . 640K. Each XOR gate 640 receives one of the selected subset of signals 315 (e.g., 315A) from the signal selector 310 and the previous state 325 (e.g., 325A) of the signal 315 from the memory device 320. If the current state and the previous state 325 of the signal 315 are different, the XOR gate 640 generates a value comparison signal 345 in a high state to indicate an event has been detected for the signal. If the current state and the previous state 325 are the same, the XOR gate 640 generates a value comparison signal 345 in a low state to indicate that the value did not change for the signal.

Figure 7:
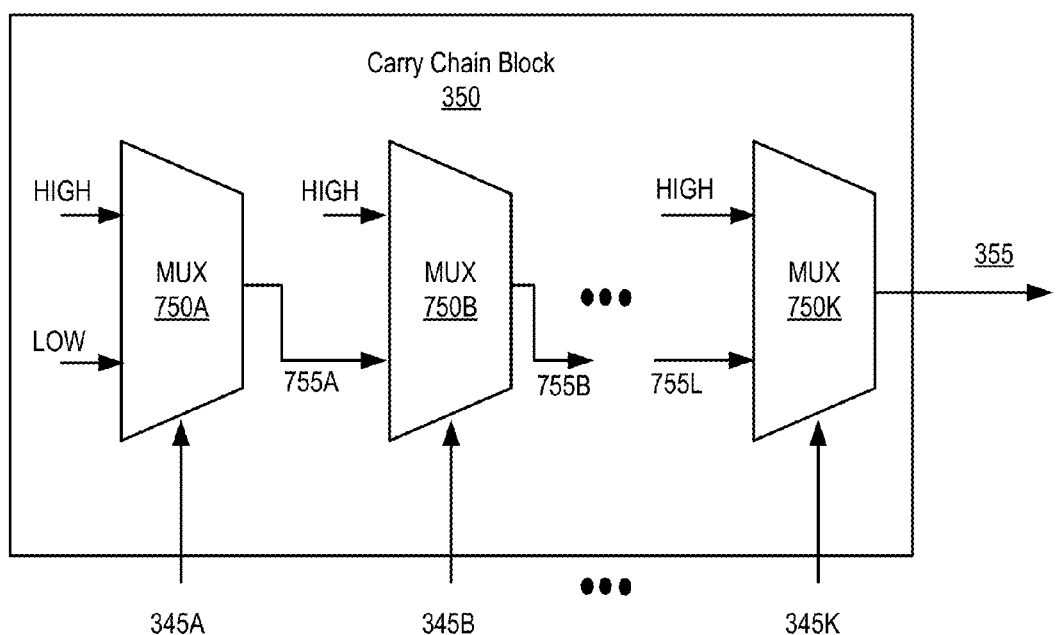
FIG. 7 is a circuit diagram of a carry chain block of the global event detection logic, according to one embodiment.

FIG. 7 is a circuit diagram of the carry chain block 350, according to one embodiment. The carry chain block 350 receives the value comparison signals 345A, 345B . . . 345K from the value comparator 340 during a time period corresponding to the selected subset of signals 315. The carry chain block 350 generates a carry chain output 355 to indicate whether at least one value changed in the selected subset of signals 315 according to the value comparison signals 345. In one embodiment, the carry chain block 350 includes MUXs 750A, 750B . . . 750K that are connected in series to propagate to the carry chain output 355 a high state if any one of the value comparison signals 345A, 345B . . . 345K is in a high state.

In one embodiment, MUX 750A receives as fixed inputs a high state and a low state and receives the value comparison signal 345A as a control signal. The MUX 750A generates its output, an indication signal 755A, according to the value comparison signal 345A. The MUX 750A selects to output the high state as the indication signal 755A if the first value comparison signal 345A is in the high state. However, the MUX 750A selects to output the low state as the indication signal 755A if the value comparison signal 345A is in the low state.

Each of the subsequent MUXs 750B through 750K in the series receives as inputs a fixed high state and the indication signal 755 output by the preceding MUX 750 in the series. For example, MUX 750B receives the indication signal 755A as an input. Each of the subsequent MUXs 750B through 750K also receives a corresponding value comparison signal 345 as a control signal. If the corresponding value comparison signal 345 is in a high state, the subsequent MUX selects the high state as its output indication signal 755. If the corresponding value comparison signal 345 is in a low state, the subsequent MUX selects the indication signal 755 output by the preceding MUX 750 as its output indication signal 755. The indication signal output by MUX 750K is the carry chain output 355. Since each of the subsequent MUXs 750B through 750K receives as an input the indication signal 755 output by the preceding MUX 750, if any MUX 750 outputs a high state because its corresponding value comparison signal 345 is in a high state, the high state will propagate to each of the subsequent MUXs 750 and eventually to the carry chain output 355 (i.e., the carry chain output 355 will be in a high state). For example, assume the value comparison signal 345A is in a high state, as a result MUX 750A will output the high state as the indication signal 755A. Hence, the two inputs to MUX 750B will be high states. Therefore, regardless of the value of value comparison signal 345B, a high state will be output by MUX 750B. Each of the subsequent MUXs 750 will also have two high states as inputs and output a high state until finally MUX 750K outputs the high state as the carry chain output 355. On the other hand, if each of the value comparison signals 345 is in a low state (no events detected for any of the selected subset of signals 315), each MUX 750 will output a low state and as a result the carry chain output 355 will have a low state. In other embodiments, the MUXs 750 of the carry chain block 350 may be replaced with an OR gate or multiple levels of OR gates.

Figure 8A:
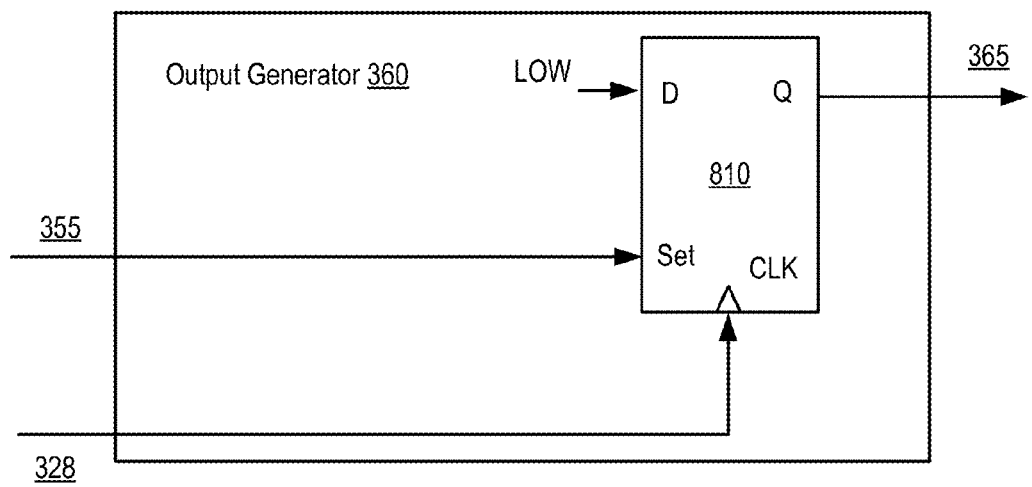
FIGS. 8A through 8C are circuit diagrams of output generators of the global event detection logic, according to different embodiments.

FIG. 8A is a circuit diagram of the output generator 360, according to one embodiment. In one embodiment, the output generator 360 receives the carry chain output 355 and generates the global event detection signal 365. The output generator 360 resets the global event detection signal 365 when one clock cycle of the DUT clock signal 328 ends/next clock cycle of the DUT clock signal 328 starts (e.g., at a rising edge of the DUT clock signal 328).

In this embodiment, the output generator 360 is implemented as a flip flop 810 that receives the carry chain output 355 from the carry chain block 350 in a current time period of a DUT clock cycle and generates the global event detection signal 365 based on the received carry chain output 355 and the global event detection signal 365 in a previous time period before the current time period. The flip flop 810 receives as an input a fixed low state, the DUT clock signal 328 as a reference CLK, and the carry chain output 355 from the carry chain block 350 as an asynchronous set signal. When a clock cycle of the DUT clock signal 328 starts (e.g., at a rising edge of the DUT clock signal 328), the flip flop 810 resets the global event detection signal 365 and outputs the global event detection signal 365 in the low state based on the fixed low state input. If the flip flop 810 receives the carry chain output 355 in the high state in any of the DUT clock cycle time periods, the flip flop 810 outputs the global event detection signal 365 in the high state. Once the global event detection signal 365 is in the high state, the flip flop 810 maintains the global event detection signal 365 in the high state until the current DUT clock cycle ends (e.g., at a next rising edge of the DUT clock signal 328). At the end of the current DUT clock cycle, the global event detection signal 365 is reset to the low state. Hence, in this embodiment, the global event detection signal 365 will have a high state during a DUT clock cycle if the global event detection logic 300 determines that at least one event occurred among the design signal 305 during the DUT clock cycle. In another embodiment, the flip flop 810 is replaced with a latch or a register.

Figure 8B:
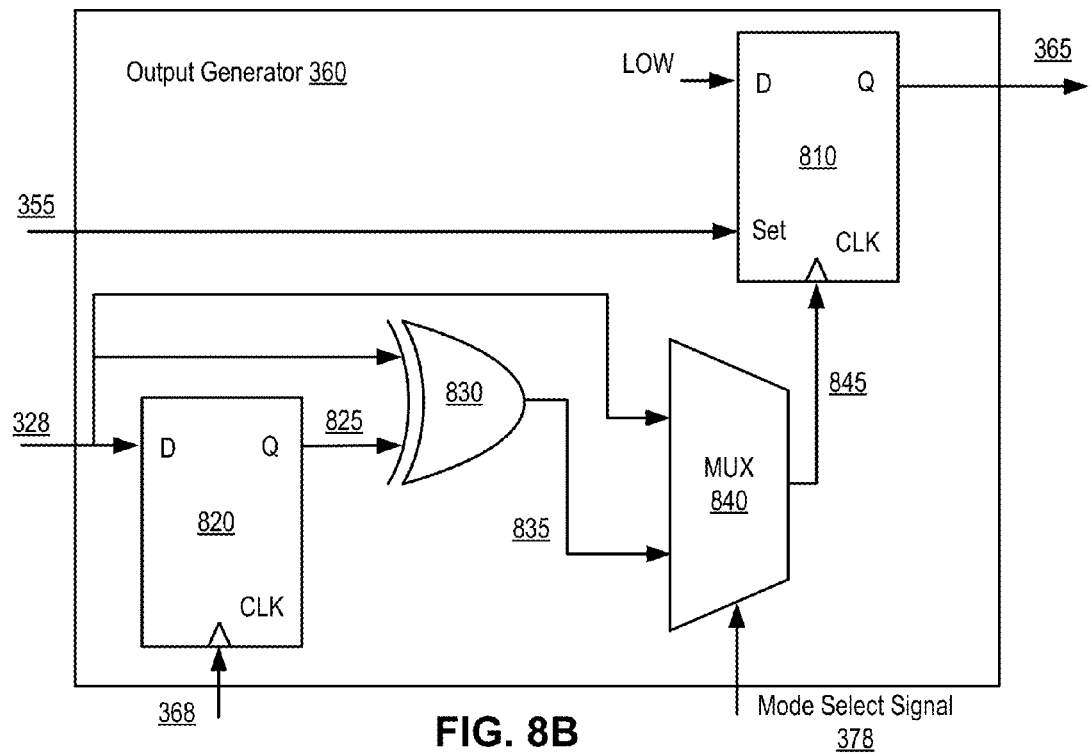

FIG. 8B is a circuit diagram of the output generator 360, according to another embodiment. The output generator 360 receives as inputs the carry chain output 355 from the carry chain block 350, the DUT clock signal 328, and a detection clock signal 368. Further, the output generator 360 generates the global event detection signal 365.

In this embodiment, the output generator 360 and the global event detection logic 300 as a whole can operate in one of two modes. In the first mode each of the design signals 305 is analyzed once during a DUT clock cycle and the global event detection signal 365 output by the output generator 360 indicates whether at least one event occurred among the design signals 305 during the DUT clock cycle (i.e., the output generator 360 operates as described in FIG. 8A). In the second mode each of the design signals 305 is analyzed twice in a clock cycle of the DUT clock signal 328, once during a high state of the DUT clock signal 328 and another during a low state of the DUT clock signal 328. Hence, in the second mode the global event detection signal 365 output by the output generator 360 during the high state of the DUT clock signal 328 indicates whether at least one event occurred among the design signals 305 during the high state (e.g., after the rising edge and before the falling edge of the DUT clock signal). Further, the global event detection signal 365 output by the output generator 360 during the low state of the DUT clock signal 328 indicates whether at least one event occurred among the design signals 305 during the low state (e.g., after the falling edge and before the rising edge of the DUT clock signal). To determine which mode to operate in, the output generator 360 receives a mode select signal 378 which indicates which mode the output generator 360 should operate in.

In one embodiment, the output generator 360 includes a first flip flop 810, a second flip flop 820, XOR gate 830, and a MUX 840. The first flip flop 810 is configured and operates in a similar manner as the flip flop 810 of the output generator 360 in FIG. 8A, except the first flip flop 810 receives an output 845 of the MUX 840 as a reference CLK. Compared to the output generator 360 of FIG. 8A, by implementing the second flip flop 820, the XOR gate 830, and the MUX 840, the output generator 360 operates in two different modes, according to the mode select signal 378. In another embodiment, the first flip flop 810 and the second flip flop 820 are replaced with latches or registers.

The MUX 840 provides the output 845 to the first flip flop 810 according to the mode select signal 378 for determining when the global event detection signal 365 resets. The MUX 840 receives as inputs the DUT clock signal 328 and an output 835 of the XOR gate 830. The MUX 840 selects a signal between the DUT clock signal 328 and the output 835 of the XOR gate 830 to be used as the reference CLK of the first flip flop 810, according to the mode select signal 378. In the first mode, the DUT clock signal 328 is selected as the output 845. In the second mode, the output 835 of the XOR gate 830 is selected as the output 835.

In the first mode of operation, the DUT clock signal 328 is provided to the reference CLK of the first flip flop 810 through the MUX 840, hence the output generator 360 operates in the same manner as the output generator 360 of FIG. 8A. Therefore, the output generator 360 resets the global event detection signal 365 when a clock cycle of the DUT clock signal 328 ends/next clock cycle of the DUT clock signal 328 starts.

In the second mode of operation, the output 835 of the XOR gate 830 is provided to the reference CLK of the first flip flop 810 through the MUX 840. The second flip flop 820 and the XOR gate 830 operate together to indicate when a state of the DUT clock signal 328 changes. In one embodiment, the output 835 of the XOR gate 830 is in a high state, when the DUT clock signal 328 transitions from the high state to the low state or from the low state to the high state. The output 835 of the XOR gate 830 is in a low state, when a current state of the DUT clock signal 328 and a previous state of the DUT clock signal is not changed. Hence, in the second mode of operation, the output generator 360 resets the global event detection signal 365 when the state of the DUT clock signal 328 changes (e.g., at a rising edge and a falling edge of the DUT clock signal 328).

The second flip flop 820 and the XOR gate 830 operate together to detect a change of state in the DUT clock signal 328. In one embodiment, the second flip flop 820 receives the DUT clock signal 328 as an input and the detection clock signal 368 as the reference CLK, where the detection clock signal 368 is equal to or faster than a least significant bit (LSB) of the address signal 335 in the first mode. The second flip flop 820 provides a previous state of the DUT clock signal as an output 825 according to the detection clock signal 368.

The XOR gate 830 receives the output 825 of the second flip flop 820 as an input and the DUT clock signal 328 as another input. The XOR gate 830 compares the output 825 of the second flip flop 820 and the DUT clock signal 328 to compare a current state of the DUT clock signal 328 and the previous state of the DUT clock signal according to the detection clock signal 368. According to the comparison, the XOR gate 830 generates the output 835 to indicate whether a state of the DUT clock signal 328 is changed according to the detection clock signal 368. In one embodiment, the XOR gate 830 generates the output 835 of the XOR gate 830 in the high state if a state of the DUT clock signal 328 changes, or in the low state if a current state of the DUT clock signal 328 and a previous state of the DUT clock signal are the same.

As described above, in the second mode of operation the global event detection logic 300 analyzes the design signals 305 twice during one clock cycle of the DUT clock signal 328 (once during the high state and once during the low state of the DUT clock signal 328). Hence, in one embodiment, a frequency of the detection clock signal 368 is twice the frequency for generating the address signal 335 in the first mode. In the second mode so that the design signals 305 can be analyzed twice during one DUT clock cycle, the signal controller 330 generates the address signal 335 at least twice the frequency in which the address signal 335 is generated in the first mode. In one embodiment, the detection clock signal 368 is a LSB of the address signal 335. In one embodiment, in the second mode the memory device 320 performs only a read operation when the DUT clock signal 328 is in one state (e.g., high state), and performs both read and write operations when the DUT clock signal 328 is in another state (e.g., low state). In another embodiment, in the second mode, the memory device 320 performs both read and write operations when the DUT clock signal 328 is in the high state or the low state. In another embodiment, the global event detection logic 300 includes two memory devices 320 where a first memory device 320 is operated in the high state and a second memory device 320 is operated in the low state. As a result, the global event detection logic 300 in the second mode can analyze the design signals 305 twice during one clock cycle of the DUT clock signal 328. For example, the global event detection logic 300 analyzes the design signals 305 when the DUT clock signal 328 is in a high state without storing the states of the design signals 305 in the memory device 320, and resets the global event detection signal 365 when the DUT clock signal 328 changes from the high state to a low state. Additionally, the global event detection logic 300 analyzes the design signals 305 once more when the DUT clock signal 328 is in the low state, updates states of the design signals 305 in the memory device 320, and resets the global event detection signal 365 when the DUT clock signal 328 changes from the low state to the high state. Detail timing operation of the output generator 360 is described in more detail with respect to FIG. 9B.

In one embodiment, the address signal 335 is generated from an independent source instead of from the signal controller 330. The address signal 335 is also independent from the DUT clock signal 328, and can be asynchronous to it. In this case the design signal 305 is analyzed at least, or more, than 2 times per cycle.

Figure 8C:
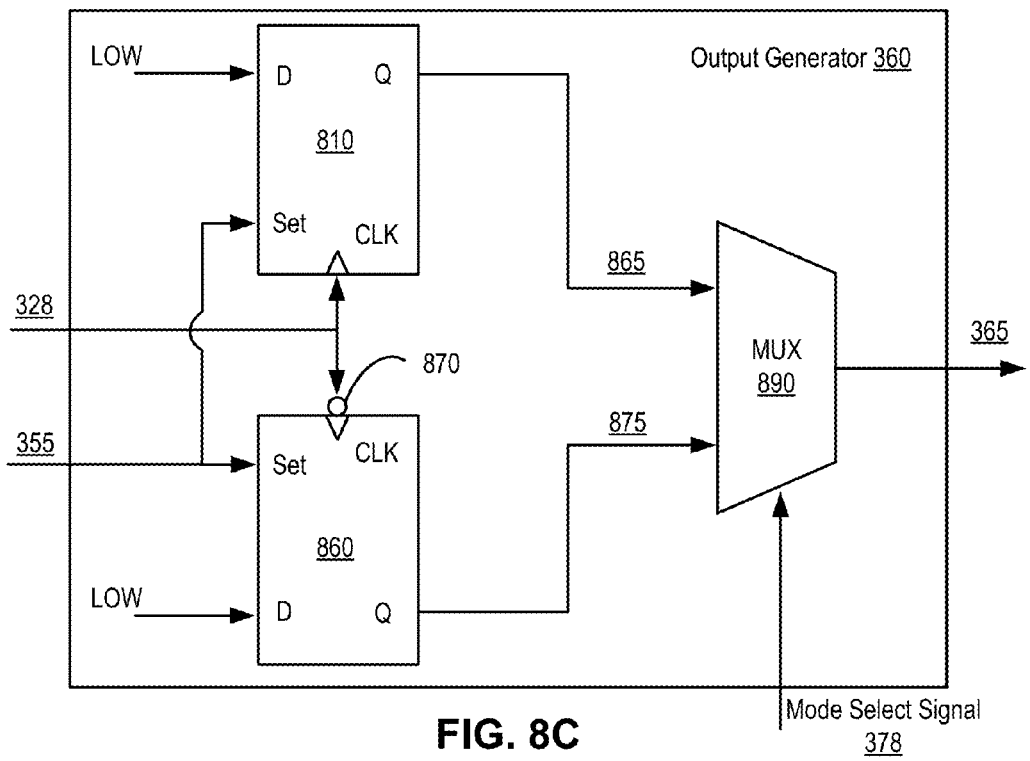

FIG. 8C is a circuit diagram of the output generator 360, according to another embodiment. The output generator 360 receives as inputs the carry chain output 355 from the carry chain block 350 and the DUT clock signal 328. The output generator 360 also receives the mode select signal 378 to determine an operation mode of the output generator 360. Like in FIG. 8B, the output generator 360 operates in one of the two modes (the first mode and the second mode). The mode select signal 378 indicates whether the output generator 360 should operate in the first mode or the second mode.

In one embodiment, the output generator 360 includes a first flip flop 810, a second flip flop 860, an inverter 870, and a MUX 890. The first flip flop 810 operates in a similar manner as in the flip flop 810 of the output generator 360 in FIG. 8A, except the MUX 890 receives an output 865 of the first flip flop 810. Compared to the output generator 360 of FIG. 8A, by implementing the second flip flop 860, the inverter 870, and the MUX 890, the output generator 360 can operate in two different modes depending on the mode select signal 378. In another embodiment, the first flip flop 810 and the second flip flop 860 are replaced with latches or registers.

The MUX 890 provides the global event detection signal 365 according to the mode select signal 378. The MUX 890 receives as inputs the output 865 of the first flip flop 810 and an output 875 of the second flip flop 860. The MUX 890 selects a signal between the output 865 of the first flip flop 810 and the output 875 of the second flip flop 860 to be outputted as the global event detection signal 365, according to the mode select signal 378. In the first mode, the output 865 of the first flip flop 810 is selected as the global event detection signal 365. In the second mode, the output 875 of the second flip flop 860 is selected as the global event detection signal 365.

In the first mode of operation, the output 865 of the first flip flop 810 is selected to be outputted as the global event detection signal 365, hence the output generator 360 operates in the same manner as the output generator 360 of FIG. 8A. Therefore, the output generator 360 resets the global event detection signal 365 when one clock cycle of the DUT clock signal 328 ends.

In the second mode of operation, the output 875 of the second flip flop 860 is selected to be outputted as the global event detection signal 365. The second flip flop 860 is configured and operates in a similar manner as in the flip flop 810 of the output generator 360 in FIG. 8A, except the MUX 890 receives the output 875 of the second flip flop 860 and the inverter 870 is placed between the DUT clock signal 328 and the reference CLK of the second flip flop 860. Thus, the second flip flop 860 and the inverter 870 together operate as a negative edge triggered flip flop. In the second mode of operation, the DUT clock signal 328 is applied to the MUX 890 as the mode select signal 378, such that output of the MUX 890 is toggled according to the DUT clock signal 328. Therefore, the output generator 360 resets the global event detection signal 365 when the state of the DUT clock signal 328 changes (e.g., at a rising edge and a falling edge of the DUT clock signal 328). Hence, the output generator 360 of FIG. 8C operates like the output generator 360 of FIG. 8B but with the use of different logic.

FIG. 9A illustrates example waveforms for detecting an event in a plurality of signals, according to one embodiment. The global event detection logic 300 including the output generator 360 of FIG. 8A or any one of the output generators 360 of FIGS. 8B and C in the first mode of operation can operate according to the waveforms in FIG. 9A. FIG. 9A includes waveforms for the DUT clock signal 328, LSB of the address signal 335, carry chain output 355, and the global event detection signal 365.

In FIG. 9A, one clock cycle 911 of the DUT clock signal 328 is divided into four time periods 912, 922, 932, 942, and four subsets (e.g., H=4) of design signals 305 can be analyzed during the clock cycle 911 (one subset during each time period of the clock cycle 911). The global event detection logic 300 analyzes a first subset of signals during the time period 912, a second subset of signals during the time period 922, a third subset of signals during a time period 932, and a fourth subset of signals during a time period 942.

In this example, at a rising edge 905 of the clock cycle 911 of the DUT clock signal 328, the output generator 360 resets the global event detection signal 365 to a low state. In the time period 912, no event is detected in the first subset of design signals. As a result, the carry chain output 355 is in a low state and the global event detection signal 365 is remained in the low state to indicate no event has been detected in the design signals 305. In the time period 922, an event is detected in the second subset of design signals. As a result, the carry chain output 355 is in a high state and the global event detection signal 365 is transitioned to the high state to indicate an event occurred in the design signals 305 during the clock cycle 911. After detecting an event, regardless of later subsets of signals in the time periods 932 and 942, the global event detection signal 365 is maintained in the high state until a next rising edge 945 of the DUT clock signal 328 is detected. The global event detection signal 365 is reset to the low state, responsive to detecting the next rising edge 945.

FIG. 9B illustrates example waveforms for detecting an event in a plurality of signals using the global event detection logic 300 in the second mode and employing the output generator of FIG. 8B or 8C, according one embodiment. FIG. 9B includes waveforms for the DUT clock signal 328, LSB of the address signal 335, carry chain outputs 355, and the global event detection signal 365.

In FIG. 9B, one clock cycle 911 of the DUT clock signal 328 is divided into eight time periods 912A, 922A, 932A, 942A, 912B, 922B, 932B, 942B. The four subsets (e.g., H=4) of design signals 305 can be analyzed twice during the clock cycle 911 of the DUT clock signal 328. When the DUT clock signal 328 is in the high state, the global event detection logic 300 analyzes the first subset of signals during the time period 912A, the second subset of signals during the time period 922A, the third subset of signals during the time period 932A, and the fourth subset of signals during the time period 942A. Additionally, when the DUT clock signal 328 is in the low state, the global event detection logic 300 again analyzes the first subset of signals during the time period 912B, the second subset of signals during the time period 922B, the third subset of signals during the time period 932B, and the fourth subset of signals during the time period 942B.

At the rising edge 905 of the clock cycle 911 of the DUT clock signal 328, the output generator 360 resets the global event detection signal 365 to a low state. In the time periods 912A and 922A, no event is detected in the first and second subsets of design signals. As a result the carry chain output 355 is in the low state and the global event detection signal 365 is remained in the low state to indicate no event has been detected in the design signals 305 during the high state of the clock cycle 911. In the time period 932A, an event is detected in the third subset of design signals. As a result, the carry chain output 355 is in the high state and the global event detection signal 365 is transitioned to the high state.

After detecting the event, regardless of a later subset of signals in the fourth time period 942A, the global event detection signal 365 is maintained in the high state until a falling edge 955 of the DUT clock signal 328 is detected. The global event detection signal 365 is reset to the low state responsive to detecting the falling edge 955.

The global event detection logic 300 analyzes the design signals 305 again when the DUT clock signal 328 is in the low state. In the time period 912B, no event is detected in the first subset of design signals. As a result, the carry chain output 355 is in the low state and the global event detection signal 365 is remained in the low state to indicate no event has been detected in the design signals 305 during the low state of the clock cycle 911. In the time period 922B, an event is detected in the second subset of design signals. As a result, the carry chain output 355 is in the high state and the global event detection signal 365 is transitioned to the high state to indicate an event has been detected among the design signals 305 during the low state of the clock cycle 911. After detecting an event, regardless of later subsets of signals in the time periods 932B and 942B, the global event detection signal 365 is maintained in the high state until a next rising edge 945 of the DUT clock signal 328 is detected. The global event detection signal 365 is reset to the low state responsive to detecting the next rising edge 945.

As illustrated in this example, by analyzing the design signals 305 twice in the second mode as illustrated in FIG. 9B, events in the design signals 305 may be detected after a falling edge of the DUT clock signal 328. For example, an event may have occurred in the second subset of signals that may operate based on a falling edge of the DUT clock signal 328. In the second mode of operation, the global event detection logic is capable of detecting the event occurred during time period 922B.

Beneficially, the global event detection logic 300 achieves savings of number of hardware implemented on the emulator 120 by multiplexing. The global event detection logic 300 achieves savings of hardware implemented by almost a multiplexing rate (e.g. H number of time periods per one clock cycle of the DUT clock signal 328). As an example, if a DUT includes one million design signals to monitor, without the disclosed global event detection logic 300, at least 1,000,000 registers (or flip flops), 1,000,000 XOR gates, or LUT with 2 inputs, and at least 200,000 of six-input OR gates, or LUT with six inputs, would have to be implemented for detecting an event in a signal from one million design signals 305. If implemented as a specialized emulation ASIC, the equivalent in transistors are implemented to perform the same operations in the FPGA. In contrast, where a single global event detection logic 300 can analyze up to 512 signals (e.g., K=32 and H=16), the global event detection logic 300 implements 250,000 LUT with six inputs, 250,000 for signal selector 310, 31,250 XOR with 2 inputs or LUT with 2 inputs for the value comparator, and 31,250 flip-flops or registers for the output generator 360 (flip flop 820, XOR gate 830 and MUX 840 can be shared between all output generators instances). The carry-chain block does not use any LUT in FPGA-based technologies and only 31,250 transistors on an ASIC implementation. This would also use 2,000 memories devices 320 (e.g., embedded in FPGA). This choice of K and H values gives a gain of about 93% of the registers used, 93% of the LUT or XOR with 2 inputs used, and a small loss of 25% of LUT with 6 inputs (with three LUT with two inputs equivalent to one LUT with 6 inputs, the global gain of number of LUT with 2 inputs is still about 82%) Larger savings in hardware resources can be achieved if higher multiplexing rate can be used (i.e., higher H value). Therefore, the global event detection logic 300 allows a huge reduction of hardware implemented for detecting an event in a large number of design signals in the DUT.

Figure 10:
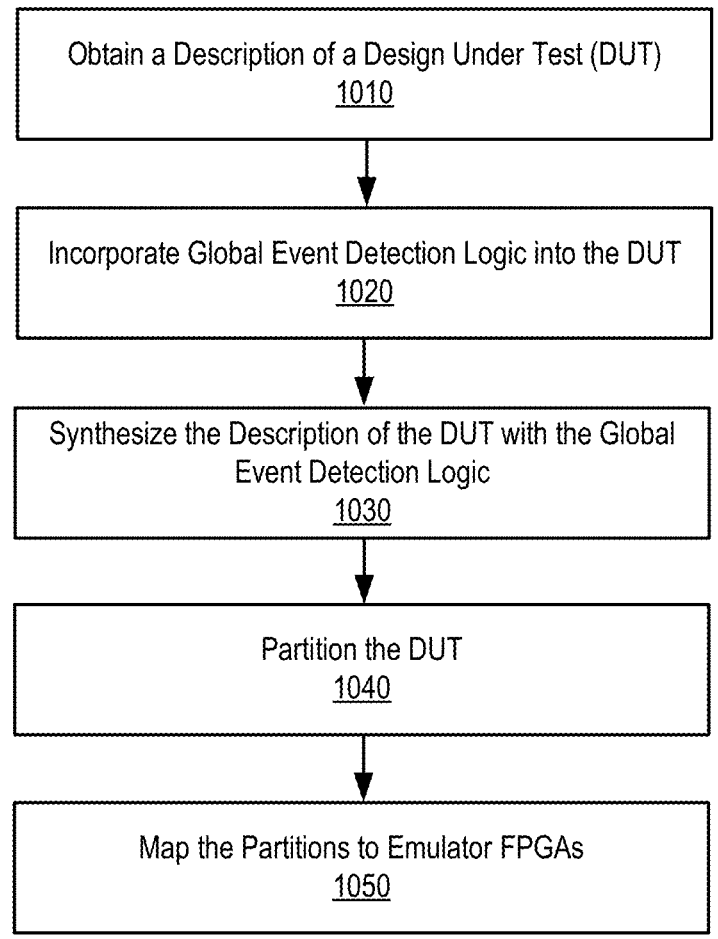
FIG. 10 is a flow chart illustrating the host system preparing a DUT for emulation, according to one embodiment.

FIG. 10 is a flow chart illustrating the host system 110 preparing a DUT for emulation, according to one embodiment. Other embodiments can perform the steps of FIG. 10 in different orders. Moreover, other embodiments can include different and/or additional steps than the ones described here.

The host system 110 obtains 1010 from a user a description of a DUT in HDL. The host system 110 incorporates 1020 the global event detection logic 300 into the DUT by editing the HDL description of the DUT. The host system 110 synthesizes 1030 the HDL description of the DUT with the global event detection logic 300 incorporated to create a gate level netlist.

The host system 110 partitions 1040 the DUT at the gate level into a number of partitions using the gate level netlist. In other embodiments, instead of incorporating the global event detection logic 300 into the DUT prior to synthesizing and partitioning, the global event detection logic 300 is incorporated after synthesizing the HDL description or after partitioning the DUT. The host system 110 maps 1050 each partition to one or more FPGAs of the emulator 120.

Figure 11:
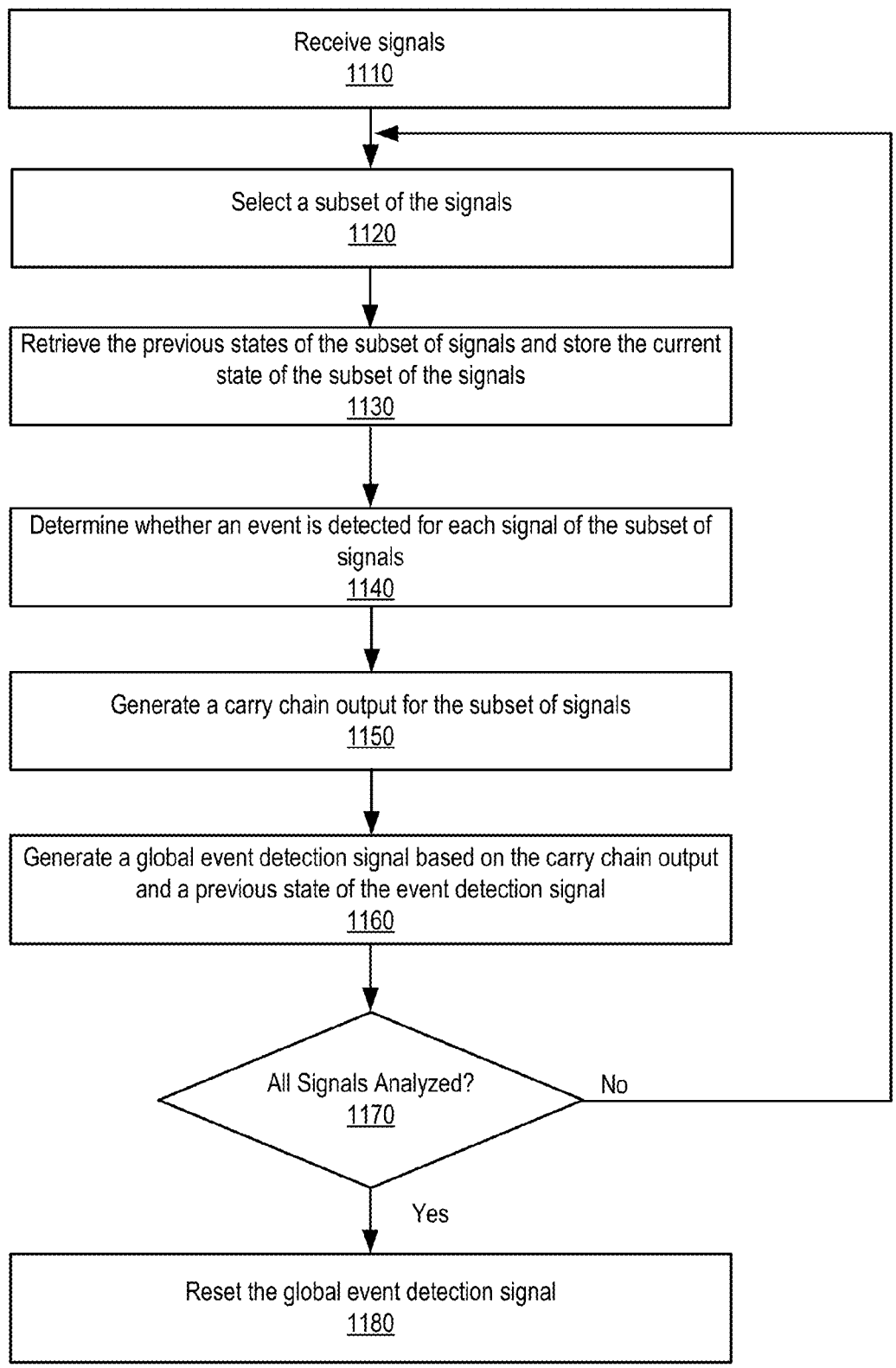
FIG. 11 is a flow chart illustrating an emulator detecting an event in a plurality of signals, according to one embodiment.

FIG. 11 is a flow chart illustrating a process performed by the emulator 120 when emulating a DUT incorporated with the global event detection logic 300, according to one example embodiment. In this embodiment, the process illustrated in FIG. 11 is performed during a single clock cycle of the DUT. The process is repeated for each subsequent DUT clock cycle. Other embodiments can perform the steps of FIG. 11 in different orders. Moreover, other embodiments can include and/or additional step than the one described here.

At the start of the process, the emulator 120 with the global event detection logic 300 receives 1110 multiple signals of the DUT. The emulator 120 selects 1120 a subset of signals from the received signals. The emulator 120 retrieves 1130 stored previous states of the subset of signals (the state of each signal in the DUT clock cycle prior to the current DUT clock cycle) and stores the current state subset of the signals 315. For each signal of the subset of signals, the emulator 120 determines 1140 whether an event is detected by comparing the current state of the signal to the retrieved previous state of the signal.

The emulator 120 generates 1150 a carry chain output for the subset of signals according to the determination in step 1140. In one embodiment, if an event is detected in a signal from the subset of signals, the emulator 120 generates the carry chain output in a high state during a current time period of the DUT clock cycle corresponding to when the subset of signals 315 are analyzed. If an event is not detected in any of the subset of signals, the emulator 120 generates the carry chain output in a low state during the current time period.

The emulator 120 generates 1160 a global event detection signal based on the carry chain output in the current time period and the global event detection signal in a previous time period of the clock cycle. In one embodiment, if the global event detection signal in the previous time period was in a low state and the carry chain output in the current time period is in the low state, the emulator 120 generates the global event detection signal in the low state to indicate no event has yet been detected among the multiple signals during the current DUT clock cycle. If the global event detection signal in the previous time period was in a low state and/or the carry chain output 355 in the current time period is in the high state, the emulator 120 generates the global event detection signal in the high state to indicate at least one event has been detected among the received signals during the current DUT clock cycle.

The emulator 120 determines whether all signals have been analyzed 1170 during the current DUT clock cycle. In one embodiment, the emulator 120 determines that all signals have been analyzed if it detects the rising edge of the next DUT clock cycle. If the rising edge of the DUT clock cycle is not detected, the emulator 120 repeats steps 1120-1160 during a subsequent time period of the current DUT clock cycle but for another subset of the received signals (i.e., the emulator 120 analyzes another subset of the received signals for events during the subsequent time period). If all the signals have been analyzed during the current DUT clock cycle (the rising edge of the next DUT clock cycle is detected), the emulator 120 resets 1180 the global event detection signal and the carry chain output. In one embodiment, the emulator 120 resets the global event detection signal in the next design clock cycle, after completing H number of analysis. In another embodiment, the emulator 120 implements an indicator to indicate whether all signals have been analyzed or not, and resets the global event detection signal according to the indicator indicating that all signals have been analyzed.

In another embodiment, all signals are analyzed twice within one clock cycle of the DUT. In this embodiment, steps 1120-1170 are performed by the emulator 120 during a first state (e.g., high state) of the DUT clock cycle and all the received signals are analyzed during the first state of the DUT clock cycle. When the DUT clock cycle transitions from the first state to a second state (e.g., transitions to a low state), the emulator 120 resets the global event detection signal and repeats steps 1120-1170 again to analyze the signals during the second state of the DUT clock cycle.

Computing Machine Architecture

Figure 12:
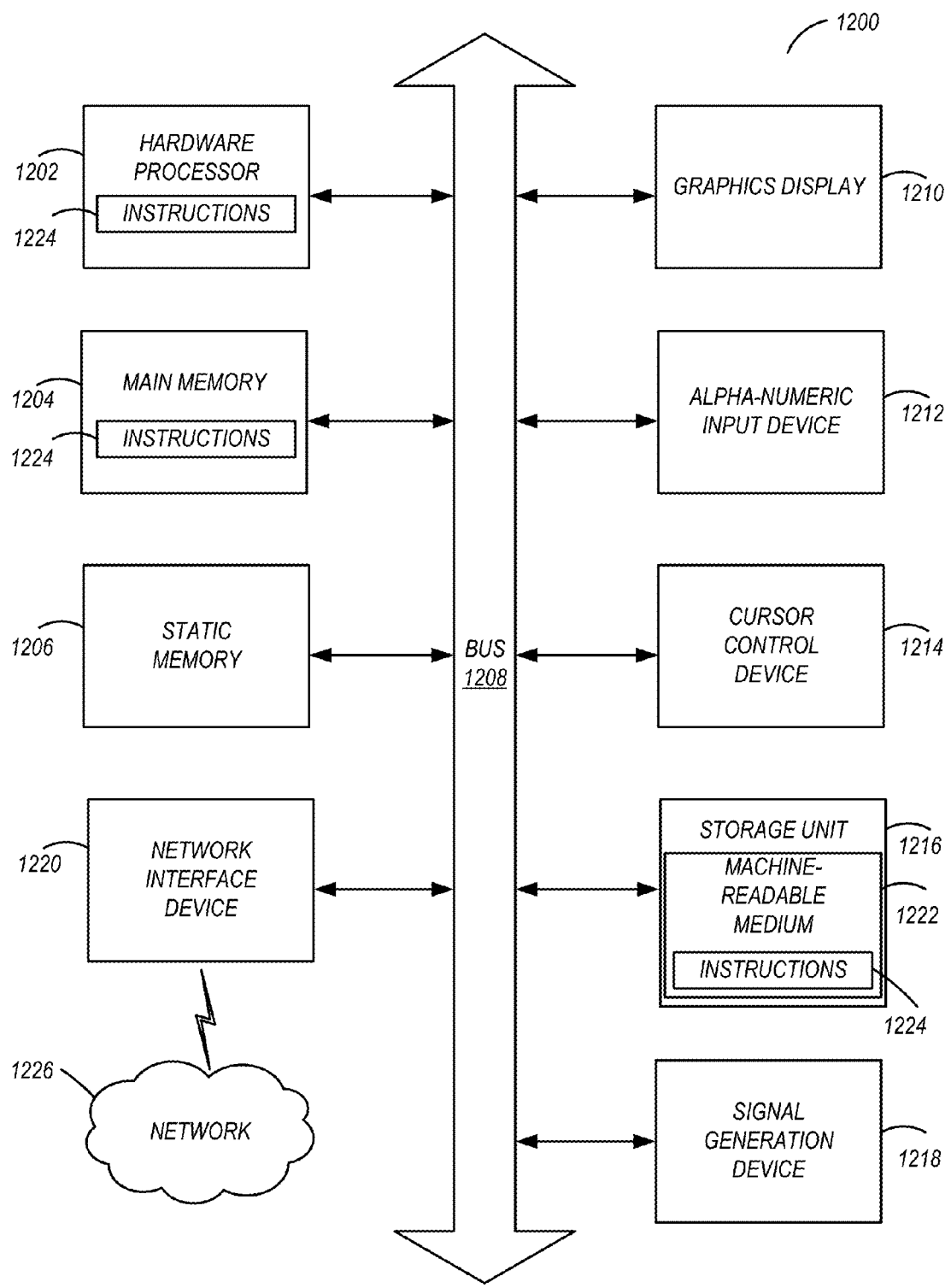
FIG. 12 illustrates one embodiment of components of an example machine able to read instructions from a machine-readable medium and execute them in a processor (or controller).

Turning now to FIG. 12, it is a block diagram illustrating components of an example machine able to read instructions from a machine-readable medium and execute them in a processor (or controller). Specifically, FIG. 12 shows a diagrammatic representation of a machine in the example form of a computer system 1200 within which instructions 1224 (e.g., software or program code) for causing the machine to perform (execute) any one or more of the methodologies described with FIGS. 1-11. The computer system 1200 may be used for one or more of the entities (e.g., host system 110, emulator 120) illustrated in the emulation environment 100 of FIG. 1.

The example computer system 1200 includes a hardware processor 1202 (e.g., a central processing unit (CPU), a graphics processing unit (GPU), a digital signal processor (DSP), one or more application specific integrated circuits (ASICs), one or more radio-frequency integrated circuits (RFICs), or any combination of these), a main memory 1204, and a static memory 1206, which are configured to communicate with each other via a bus 1208. The computer system 1200 may further include graphics display unit 1210 (e.g., a plasma display panel (PDP), a liquid crystal display (LCD), a projector, or a cathode ray tube (CRT)). The computer system 1200 may also include alphanumeric input device 1212 (e.g., a keyboard), a cursor control device 1214 (e.g., a mouse, a trackball, a joystick, a motion sensor, or other pointing instrument), a storage unit 1216, a signal generation device 1218 (e.g., a speaker), and a network interface device 1220, which also are configured to communicate via the bus 1208.

The storage unit 1216 includes a machine-readable medium 1222 which stores instructions 1224 (e.g., software) embodying any one or more of the methodologies or functions described herein. The instructions 1224 (e.g., software) may also reside, completely or at least partially, within the main memory 1204 or within the processor 1202 (e.g., within a processor's cache memory) during execution thereof by the computer system 1200, the main memory 1204 and the processor 1202 also constituting machine-readable media. The instructions 1224 (e.g., software) may be transmitted or received over a network 1226 via the network interface device 1220.

While machine-readable medium 1222 is shown in an example embodiment to be a single medium, the term "machine-readable medium" should be taken to include a single medium or multiple media (e.g., a centralized or distributed database, or associated caches and servers) able to store instructions (e.g., instructions 1224). The term "machine-readable medium" shall also be taken to include any medium that is capable of storing instructions (e.g., instructions 1224) for execution by the machine and that cause the machine to perform any one or more of the methodologies disclosed herein. The term "machine-readable medium" includes, but not be limited to, data repositories in the form of solid-state memories, optical media, and magnetic media.

As is known in the art, a computer system 1200 can have different and/or other components than those shown in FIG. 12. In addition, the computer system 1200 can lack certain illustrated components. For example, a computer system 1200 acting as the emulator 120 may include one or more hardware processors 1202, multiple storage units 1216, a network interface device 1220, and multiple configurable logic circuits (as described above with reference to FIG. 1), among other components, but may lack an alphanumeric input device 1212 and a cursor control device 1214. For another example, a computer system 1200 acting as a host system 110 may include one or more hardware processors 1202. The host system 110 with multiple processors 1202 may perform multiple simulations in parallel on multiple threads, processes and/or machines.

Additional Configuration Considerations

It is noted that although the subject matter is described in the context of emulation environment for emulation of digital circuits and systems, the principles described may be applied to analysis of any digital electronic devices. Advantages of the disclosed configurations include sharing hardware resources to efficiently perform an event detection of complicated digital circuits and systems. Moreover, while the examples herein are in the context of an emulation environment, the principles described herein can apply to other analysis of hardware implementations of digital circuitries, including FPGA and ASIC or software simulation such as EDAs.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules, or mechanisms, for example, as illustrated in FIGS. 1-11. Modules may constitute either software modules (e.g., code embodied on a machine-readable medium or in a transmission signal) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software (or computer program code)) may be driven by cost and time considerations.

The various operations of example methods described herein may be performed, at least partially, by one or more processors, e.g., processor 1202, that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs).)

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of skill in the art will appreciate still additional alternative structural and functional designs for a system and a process for efficient event detection of a digital circuit through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A non-transitory computer readable medium comprising stored instructions for detecting at least one event in a plurality of signals of a design under test (DUT) being emulated, the instructions, when executed, to configure hardware components of an emulator to:
    select a subset of the plurality of signals of the DUT emulated;
    in response to selecting the subset of the plurality of signals, for a signal in the subset:
        identify in a memory a previous value of the signal, and
        compare a current value of the signal with the previous value; and
    generate an output indicating that at least one event occurred among the plurality of signals in response to the current value of the signal from the subset being different than the previous value of the signal.

2. The non-transitory computer readable medium of claim 1, wherein the subset of the plurality of signals of the DUT are selected from the plurality of signals of the DUT emulated at predetermined durations.

3. The non-transitory computer readable medium of claim 1, wherein the instructions further configure the emulator to compare the current value and the previous value of each signal during a respective time slot.

4. The non-transitory computer readable medium of claim 1, wherein the instructions further configure the emulator to:
    store, for each signal, the current value of the signal in a respective memory slot.

5. The non-transitory computer readable medium of claim 4, wherein the instructions configure the emulator to store, for each signal, the current value of the signal in the respective memory slot after comparing the current value of the signal and the previous value of the signal.

6. The non-transitory computer readable medium of claim 1, wherein the instructions configure the emulator to select the subset of the plurality of signals of the DUT emulated during a time period, and wherein the instructions further configure the emulator to:
    reset the output to indicate no event has been detected during a next time period in response to detecting a start of the next time period.

7. The non-transitory computer readable medium of claim 1, wherein the plurality of signals are selected and analyzed during a first time period, wherein the instructions further configure the emulator to:
    reset the output to indicate no event has been detected during a second time period in response to detecting a start of the second time period; and
    select the subset of the plurality of signals of the DUT emulated during the second time period.

8. The non-transitory computer readable medium of claim 7, wherein the instructions further configure the emulator to:
    in response to selecting the subset of the plurality of signals of the DUT emulated during the second time period, for a signal in the subset:

identify in the memory the previous value of the signal, and compare an updated current value of the signal during the second time period with the previous value; and generate an output indicating that at least one event occurred among the plurality of signals during the second time period in response to the updated current value of the signal from the subset being different than the previous value of the signal.

9. Global event detection logic circuit comprising:

a signal selector configured to select a subset of a plurality of signals of a DUT emulated by an emulator;

a memory configured to store, for a signal in the subset, a previous value of the signal;

a value comparator configured to compare, for the signal in the subset, a current value of the signal with the previous value stored in the memory; and an output generator configured to generate an output indicating that at least one event occurred among the plurality of signals in response to the current value of the signal from the subset being different than the previous value of the signal, wherein the global event detection logic circuit is emulated with the emulation of the DUT.

10. The global event detection logic circuit of claim 9, wherein the signal selector comprises a plurality of multiplexers, each of the plurality of multiplexers receiving a different group of signals from the plurality of signals and each multiplexer configured to:

select a signal from the subset of the plurality of signals in response to receiving an address signal, the selected signal included in the group of signals received by the multiplexer.

11. The global event detection logic circuit of claim 10, wherein a first multiplexer of the plurality of multiplexers receives the address signal to select the signal in the subset of the plurality of signals and a second multiplexer of the plurality of multiplexers receives the address signal to select another signal in the subset of the plurality of signals.

12. The global event detection logic circuit of claim 9, wherein the memory is further configured to provide, to the value comparator, the previous value of the signal stored in the memory and another previous value of another signal in the subset of the plurality of signals stored in the memory responsive to a memory address signal.

13. The global event detection logic circuit of claim 9, further comprising:

a carry chain block configured to:

receive a plurality of event signals from the value comparator, each event signal indicating whether an event occurred for a signal from the subset of the plurality of signals; and generate a carry chain output indicating that an event occurred among the subset of the plurality of signals in response to an event signal from the plurality of event signals indicating that an event occurred.

14. The global event detection logic circuit of claim 9, wherein the subset of the plurality of signals are selected and analyzed during a first time period, and wherein:

the signal selector is further configured to select an additional subset of the plurality of signals in response to a second time period;

the memory is further configured to store, for each signal in the additional subset, a previous value of the signal;

the value comparator is further configured to compare, for each signal in the additional subset, a current value of the signal in the additional subset with the previous value of the signal stored in the memory; and the output generator is further configured to generate the output to indicate that at least one event occurred among the plurality of signals based on determining that an event occurred for a signal in the additional subset of the plurality of signals.

15. The global event detection logic circuit of claim 14, wherein no signal in the subset of the plurality of signals is included in the additional subset of the plurality of signals.

16. The global event detection logic circuit of claim 9, wherein the subset of the plurality of signals are selected and analyzed during a first time period, and the output indicates that at least one event occurred among the plurality of signals emulated during the first time period.

17. The global event detection logic circuit of claim 16, wherein:

the output generator is further configured to reset the output to indicate no event has been detected during a second time period in response to detecting the second time period;

the signal selector is further configured to select the subset of the plurality of signals emulated during the second time period;

the memory is further configured to store, for the signal in the subset of the plurality of signals emulated during the second time period, the previous value of the signal;

the value comparator is further configured to, for the signal in the subset of the plurality of signals emulated during the second time period, an updated current value of the signal with the previous value stored in the memory; and the output generator is further configured to generate the output to indicate that at least one event occurred among the plurality of signals emulated during the second time period based on determining that an event occurred for the signal in the subset of the plurality of signals.

18. The global event detection logic circuit of claim 9, wherein the output generator comprises:

a flip flop, latch, or a register configured to generate the output at predetermined durations.

19. The global event detection logic circuit of claim 9, wherein the output generator comprises:

a first register configured to generate the output according to a rising edge of a clock cycle of the DUT; and a second register configured to generate the output according to a falling edge of the clock cycle of the DUT.

20. A method for detecting at least one event in a plurality of signals of a design under test (DUT) being emulated, the method comprising:

selecting, by an emulator comprising a plurality of hardware components, a subset of the plurality of signals of the DUT emulated;

in response to selecting the subset of the plurality of signals, for a signal in the subset:

identifying, by the emulator, in a memory a previous value of the signal, and comparing, by the emulator, a current value of the signal with the previous value; and generating, by the emulator, an output indicating that at least one event occurred among the plurality of signals in response to the current value of the signal from the subset being different than the previous value of the signal.

* * * * *